United States Patent
Tsuzuki

(10) Patent No.: US 6,806,179 B1
(45) Date of Patent: Oct. 19, 2004

(54) CONNECTION SUBSTRATE, A METHOD OF MANUFACTURING THE CONNECTION SUBSTRATE, A SEMICONDUCTOR DEVICE, AND A METHOD OF MANUFACTURING THE SEMICONDUCTOR DEVICE

(75) Inventor: Shoji Tsuzuki, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 243 days.

(21) Appl. No.: 09/671,884

(22) Filed: Jan. 10, 2001

(30) Foreign Application Priority Data

Jan. 12, 2000 (JP) ..................................... 2000-003942

(51) Int. Cl.⁷ .............................................. H01L 21/44
(52) U.S. Cl. ..................................... 438/616; 438/617
(58) Field of Search ................................. 438/106, 118, 438/458, 459, 479, 482, 483, 612, 614–616, 617, 667; 257/734–740, 700, 758, 778, 786

(56) References Cited

U.S. PATENT DOCUMENTS

| | | | | |
|---|---|---|---|---|
| 5,514,613 A | * | 5/1996 | Santadrea et al. | 438/15 |
| 5,530,262 A | * | 6/1996 | Cronin et al. | 257/10 |
| 5,571,741 A | * | 11/1996 | Leedy | 438/27 |
| 5,677,576 A | * | 10/1997 | Akagawa | 257/737 |
| 5,844,304 A | * | 12/1998 | Kata et al. | 257/620 |
| 5,977,641 A | * | 11/1999 | Takahashi et al. | 257/737 |
| 6,181,010 B1 | * | 1/2001 | Nozawa | 257/734 |
| 6,181,569 B1 | * | 1/2001 | Chakravorty | 228/122.1 |
| 6,190,940 B1 | * | 2/2001 | DeFelice et al. | 257/737 |
| 6,346,461 B1 | * | 2/2002 | McCarthy | 438/479 |

* cited by examiner

Primary Examiner—George Fourson
Assistant Examiner—Brook Kebede
(74) Attorney, Agent, or Firm—Oliff & Berridge, PLC

(57) ABSTRACT

The invention provides a connection substrate, a method of manufacturing a connection substrate, a semiconductor device, a method of manufacturing a semiconductor device which can narrow a width and a pitch of wiring, enables a multi-layer wiring, and reduces an effect of radiation heat, such as a heating tool when a semiconductor chip is mounted so that a damage such as wire disconnection or the like due to an external force is not generated. First metal wires are formed on a surface of a first glass base. An insulating film is formed on the first metal wires, and second metal wires are formed on the insulating film. Thus, in a connection substrate, the first glass base has no flexibility, so deformation is not generated. Because of this, during interim processes wherein metal wires are formed, such as in an exposure process, a glass base does not move in a depth of field direction. Therefore, exposure with a narrow width can be performed, so metal wires having a narrow pitch and a narrow width can be formed.

23 Claims, 5 Drawing Sheets

(1)

(2)

10: SEMICONDUCTOR DEVICE
12: CONNECTION BOARD
14: SEMICONDUCTOR CHIPS
16: FIRST METAL WIRING LINES (1)

(2)

(3)

(4)

(1)

(2)

(3)

(4)

CONNECTION SUBSTRATE, A METHOD OF MANUFACTURING THE CONNECTION SUBSTRATE, A SEMICONDUCTOR DEVICE, AND A METHOD OF MANUFACTURING THE SEMICONDUCTOR DEVICE

BACKGROUND OF THE INVENTION

1. Field of Invention

This invention relates to a connection substrate, a method of manufacturing a connection substrate, a semiconductor device, and a method of manufacturing a semiconductor device, and particularly, a connection substrate and a method of manufacturing a connection substrate using an insulation material that is flexible, and a semiconductor device and a method of manufacturing a semiconductor device.

2. Description of Related Art

Conventionally, a multiple-chip-package (hereafter referred to as "MCP") is known in which a wiring pattern is formed on a surface of an insulating film that is flexible (many films made of polyimide are used), and a plurality of semiconductor chips are mounted on this wiring pattern.

In the MCP having this structure, by folding an insulating film (in order to avoid a semiconductor chip) and folding the MCP itself, volume of the MCP can be reduced. Mounting of a semiconductor chip on another substrate can be accomplished by using a connection electrode formed in a rear side of a mounting surface of a semiconductor chip in the insulating film.

Furthermore, the above-mentioned connection substrate is attached to a copper foil, which becomes a wiring pattern on a surface of a flexible insulating film, and a wiring pattern is formed by coating a resist on this copper foil surface, performing exposure, and etching.

However, in the above-mentioned connection substrate, or a semiconductor device using the connection substrate, the following problems arise.

First, an insulating film has flexibility, so a connection substrate is easily deformed by an exterior force, or a force created by its own weight. Because of this, it is difficult to make an insulating film flat when exposure is performed. It is also difficult to make a wiring pattern narrow. Moreover, from the viewpoint of focusing, it is difficult to make wiring patterns and a pitch between wiring patterns narrow.

In addition, when wires between semiconductor chips or the like become complex, a method is known in which many wiring patterns are laminated. However, there is a problem that it is difficult to form many layers of wiring patterns because a wiring pattern is formed on a surface of an insulating film.

Furthermore, an insulating film has a thickness of approximately 50 $\mu$m, and has a significant amount of force to fold the insulating film. Because of this, if the folding force is not sufficient, there is a possibility that folding of an insulating film will open due to a recovery force (returning to the state before folding).

Additionally, in a semiconductor device, when a semiconductor chip is mounted on a connection substrate, a wiring pattern, which is wound around a connection substrate, and a semiconductor chip are thermally compression-bonded by using a heating tool. However, a semiconductor chip formed of a mono-crystalline silicon and a connection substrate formed of a polyimide material are significantly different with respect to thermal expansion coefficients. Because of this, there is a problem that it is difficult to make a pattern pitch narrow.

Additionally, in a semiconductor device, even after a semiconductor chip is mounted, a connection substrate itself has flexibility. Therefore, if an exterior force is applied, it is easily deformed. Because of this, there is a possibility that, if an exterior force is applied during shipping or the like, a stress would be applied between a semiconductor chip and a connection substrate, and damage such as wire disconnection might may generated.

SUMMARY OF THE INVENTION

This invention addresses the above-mentioned problems with the conventional device. An object of this invention is to provide a connection substrate, a method of manufacturing a connection substrate, a semiconductor device and a method of a semiconductor device, which makes a width and a pitch of a wiring narrow, enables multi-layer wiring, and minimizes an effect of radiation heat of a heating tool or the like in the mounting of a semiconductor chip, so that damage, such as a wire disconnection or the like, is not generated by an exterior force.

In a method of manufacturing a connection substrate in accordance with an aspect of the invention, a metal wire is formed on a base, then an insulating material is applied to the metal wire to form a flexible insulating layer, another metal wire is formed on the surface of said insulating layer, thereby connecting the metal wires which sandwich the insulating layer, through a contact hole formed in the insulating layer. The metal wires and the insulating layer are then separated from the base. According to the connection substrate, the base has no flexibility. Thus, even if an exterior force or its own weight is applied, the surface is not deformed. Because of this, during interim processes wherein metal wires are formed, such as in an exposure process, a base does not move in a depth of field direction. Therefore, exposure with a narrow width can be performed, so metal wires with a narrow pitch and a narrow width can be formed.

Additionally, an insulating agent is applied to a base so as to cover a metal wire. Thus, the thickness of an insulating layer can be set to a dimension in which a metal wire can be embedded. Because of this, the thickness of the insulating layer can be made thin, and a force can be reduced when a connection substrate is folded. Furthermore, a recovery force (spring back) of an insulating layer itself becomes small, so opening of a folded connection substrate can be prevented (returning to a state before folding can be prevented).

In addition, in the method of manufacturing a connection substrate in accordance with another aspect of the invention, the plurality of metal wires and the plurality of insulating layers are laminated. According to the method of manufacturing the connection substrate, the metal wires can be connected vertically through contact holes formed in the insulating layer. Because of this, even if the number of wires increases, interference between the metal wires can be prevented, and winding of the metal wires in the connection substrate can be easily accomplished.

In the method of manufacturing a connection substrate in accordance with another aspect of the invention, the step of applying an insulating material onto the metal wire, and the step of forming another metal wire, thereby connecting the metal wires are repeated at least two times.

In the method of manufacturing a connection substrate in accordance with another aspect of the invention, the base is formed of glass. According to the method of manufacturing the connection substrate, light can be irradiated to the connection substrate from the rear side of the glass base (opposite side in which the connection substrate is manufactured). Because of this, if solvent or the like, having a separating reaction due to light irradiation is coated between a glass base and a connection substrate, after the connection substrate is formed, the glass base and the connection base can be easily separated by radiation light from the rear side of the glass base.

In the connection substrate in accordance with another aspect of the invention, the connection substrate is manufactured by the method of manufacturing the connection substrate as set forth above. Thus, metal wires with a narrow width and a narrow pitch can be formed.

In the method of manufacturing a semiconductor device in accordance with another aspect of the invention, a connection substrate is formed on a base, wherein a metal wire is formed on a base, an insulating agent is applied to said metal wire to form a flexible insulating layer, another metal wire is formed on the surface of the insulating layer, a connection substrate is formed on the base, thereby connecting the metal wires which sandwich the insulating layer through a contact hole formed in the insulating layer. A semiconductor chip is then mounted on the metal wire which is bared, and the connection substrate is separated from the base. According to the method of manufacturing the semiconductor device, the base has no flexibility, so even if an exterior force or its own weight is applied, the surface is not deformed. Because of this, during interim processes wherein metal wires are formed, such as in an exposure process, a base does not move in a depth of field direction. Therefore, exposure with a narrow width can be performed, so metal wires with a narrow pitch and a narrow width can be formed.

Additionally, an insulating agent is applied to a base so as to cover a metal wire. Thus, the thickness of an insulating layer can be set to a dimension in which a metal wire can be embedded. Because of this, the thickness of the insulating layer can be made thin, and a force can be reduced when a connection substrate is folded. Furthermore, a recovery force (spring back) of an insulating layer itself becomes small, so opening of a folded connection substrate can be prevented (returning to a state before it is folded can be prevented).

In addition to the above-mentioned operation, in the case of mounting a semiconductor chip to a connection substrate, the connection substrate is formed on a flat base without flexibility, so a terminal of a semiconductor chip is not lifted up. Because of this, generation of conductive defects between a terminal of a semiconductor chip and a metal wire can be prevented. Furthermore, if a material which has a heat expansion coefficient which is close to the heat expansion coefficient of a semiconductor chip, is used for a base, in the case of mounting a semiconductor chip, by receiving radiation heat from a heating jig, an expansion difference between a metal wire side and a semiconductor chip side becomes large, and generation of a short circuit between adjacent terminals can be prevented.

Additionally, at a final stage after a semiconductor chip is mounted, a semiconductor device is separated from a base. Therefore, during interim processes such as conveying, a base supports a semiconductor device, and deformation of the semiconductor device due to an exterior force can be prevented.

In the method of manufacturing a semiconductor device in accordance with another aspect of the invention, in the step of forming a connection substrate, the step of applying an insulating material onto the metal wire and the step of forming another metal wire, thereby connecting the metal wires are repeated at least two times.

In the method of manufacturing a semiconductor device in accordance with another aspect of the invention, a connection substrate is formed on a base, wherein a metal wire to be connected to an electrode formed on a semiconductor chip is formed on a first base, an insulating material is applied onto the metal wire to form an insulating layer, another metal wire is formed on the insulating layer, thereby connecting the metal wires which sandwich the insulating layer, through a contact hole formed in the insulating layer. A second base is disposed on the connection substrate. The first base is separated from the connection substrate. A semiconductor chip is mounted on the metal wire that is bared. The connection substrate is separated from the second base. According to the connection substrate, the first base has no flexibility. Thus, even if an exterior force or its own weight is applied, the surface is not deformed. Because of this, during interim processes which metal wires are formed, such as in an exposure process, a base does not move in a depth of field direction. Therefore, exposure with a narrow width can be performed, so metal wires having a narrow pitch and a narrow width can be formed.

Additionally, an insulating agent coats a base so as to cover a metal wire. Thus, so the thickness of an insulating layer can be set to a dimension in which a metal wire can be embedded. Because of this, the thickness of the insulating layer can be made thin, and a force can be reduced when a connection substrate is folded. Furthermore, a recovery force (spring back) of an insulating layer itself becomes small, so opening of a folded connection substrate can be prevented (returning to a state before it is folded can be prevented).

Furthermore, after forming a connection substrate on a first base, a connection substrate is transferred to a second base. However, when a connection substrate is transferred to the second base, a surface which is separated from the first base of the connection substrate is exposed. A metal wire is formed on an exposure surface which is separated from the first base so as to form a butt joint with an element formed in a semiconductor chip. Therefore, even if a metal wire is not arranged in a semiconductor chip side, electrical conduction can be achieved between the semiconductor chip and the connection substrate.

In addition, in the case of mounting a semiconductor chip on a connection substrate, the connection substrate is formed on a flat base without flexibility, so a terminal of a semiconductor chip is not lifted up. Because of this, generation of conductive defects between a terminal of a semiconductor chip and a metal wire can be prevented. Furthermore, if a material which has a heat expansion coefficient that is similar to the heat expansion coefficient of a semiconductor chip, is used for a second base, in the case of mounting a semiconductor chip, by receiving radiation heat from a heating jig, an expansion difference between a metal wire side and a semiconductor chip side becomes large, and generation of a short circuit between adjacent terminals can be prevented.

Furthermore, in the final step after a semiconductor chip is mounted, a semiconductor device is separated from the second base. Therefore, the first base supports the connection substrate, and the second base supports the semiconductor device during interim processes such as conveying. Deformation of the semiconductor device due to an exterior force can be prevented.

In the method of manufacturing a semiconductor device in accordance with another aspect of the invention, multiple semiconductor chip units are mounted on the connection substrate. According to the method of manufacturing the semiconductor device, by mounting a plurality of semiconductor chips on the connection substrate, connection can be established between the semiconductor chips. Thus, multi-functions can be accomplished. In addition, the insulating layer has flexibility, so the connection substrate can be folded between the semiconductor chips, and volume of the semiconductor device can be reduced.

In the method of manufacturing a semiconductor device in accordance with another aspect of the invention, the plurality of metal wires and the plurality of insulating layers are laminated. According to the method of manufacturing the semiconductor device, connection can be accomplished between the upper and lower metal wires via contact holes formed in the insulating layer. Because of this, even if the number of wires increases, interference of the metal wires can be prevented, and winding of the metal wires in the connection substrate can be easily accomplished.

In the method of manufacturing a semiconductor device in accordance with another aspect of the invention, the base is formed of glass. According to the method of manufacturing the semiconductor device, light can be irradiated to the connection substrate from the rear surface side (the opposite side in which the connection substrate is manufactured) of the glass base. Because of this, if solvent or the like, having a separating reaction due to light irradiation is coated between a glass base and a connection substrate, after the connection substrate is formed, the glass base and the connection base can be easily separated by irradiation light from the rear side of the glass base.

In the method of manufacturing a semiconductor device in accordance with another aspect of the invention, the base is formed of silicon. According to the method of manufacturing the semiconductor device, when the semiconductor chip is mounted on a connection substrate, the connection substrate closely attaches to a base formed of silicone. Therefore, the base has a thermal expansion coefficient that is substantially the same as the thermal expansion coefficient of the semiconductor chip. Even if radiation heat is received from a heating jig which is used for mounting of the semiconductor chip, an expansion difference becomes large between a metal wiring side and a semiconductor chip side, and short-circuiting or the like between adjacent terminals can be prevented.

In the method of manufacturing a semiconductor device in accordance with another aspect of the invention, the second base is formed of glass. According to the manufacturing the semiconductor device, light can be irradiated to the connection substrate from the rear surface side (the opposite side in which the connection substrate is manufactured) of the glass base. Because of this, if solvent or the like, having a separating reaction due to light irradiation is coated between a glass base and a connection substrate, after the connection substrate is formed, the glass base and the connection base can be easily separated by irradiation light from the rear side of the glass base.

In the method of manufacturing a semiconductor device in accordance with another aspect of the invention, the second base is formed of silicon. According to the method of manufacturing the semiconductor device in accordance with another aspect of the invention, when the semiconductor chip is mounted in a connection substrate, the connection substrate closely attaches to a second base formed of silicon. Therefore, the base of a thermal expansion coefficient is substantially the same as the semiconductor chip of a thermal expansion coefficient. Even if radiation heat is received from a heating jig which is used for mounting of the semiconductor chip, an expansion difference becomes large between a metal wiring side and a semiconductor chip side, and short-circuiting or the like between adjacent terminals can be prevented.

The semiconductor device in accordance with another aspect of the invention is manufactured by the method of manufacturing a semiconductor device as set forth in any of the above aspects of the invention. According to the semiconductor device, the insulating layer has flexibility, and a thin film can be achieved, so that the connection substrate can be easily folded. Furthermore, a recovery force (spring back) of an insulating layer itself becomes small, so opening of a folded connection substrate can be prevented (returning to a state before folding can be prevented).

DETAILED DESCRIPTION OF PREFERRED EMBODIMENTS

Specific preferred embodiments of a connection substrate, a method of manufacturing a connection substrate, a semiconductor device and a method of manufacturing a semiconductor device in accordance with the invention are explained in detail with reference to the drawings.

Figure 1:
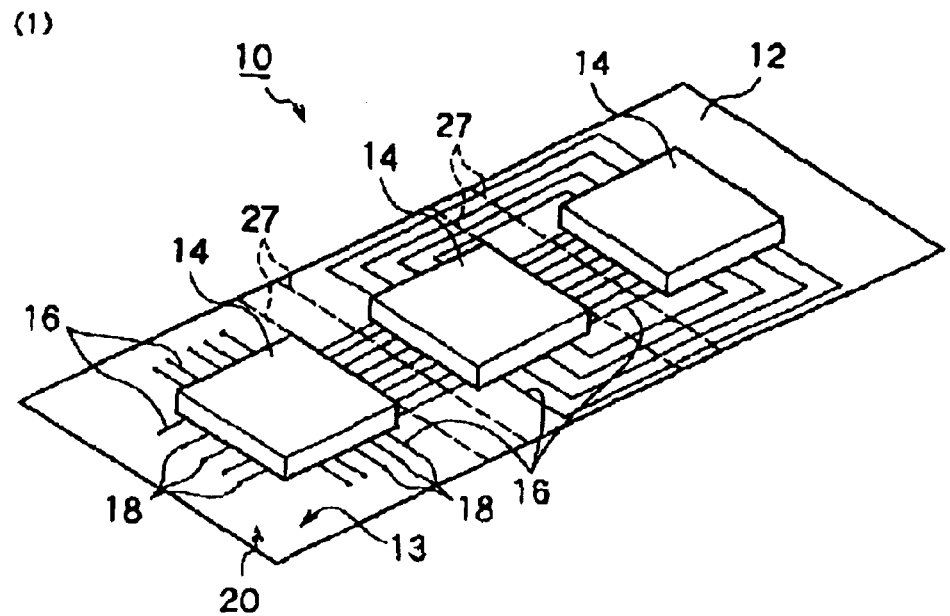
FIGS. 1(1) and (2) are a perspective view and a side view of a semiconductor device in accordance with an embodiment of the invention.
Figure 1:
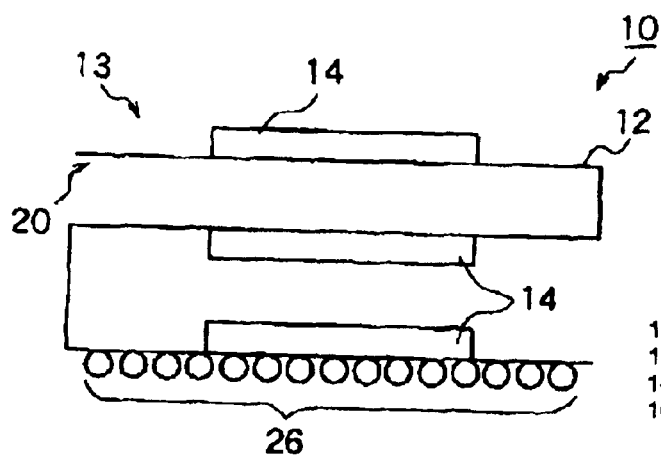
Figure 2:
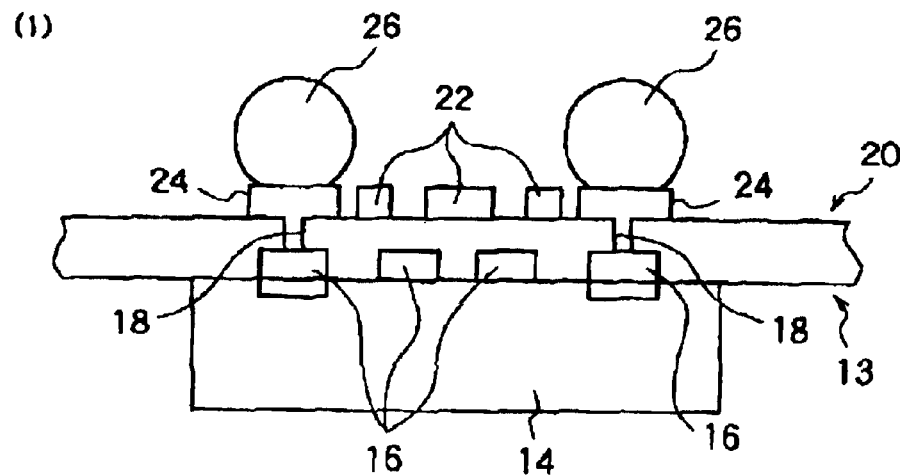
FIGS. 2(1) and (2) are a cross sectional enlarged view and a rear surface view showing the same semiconductor device.
Figure 2:
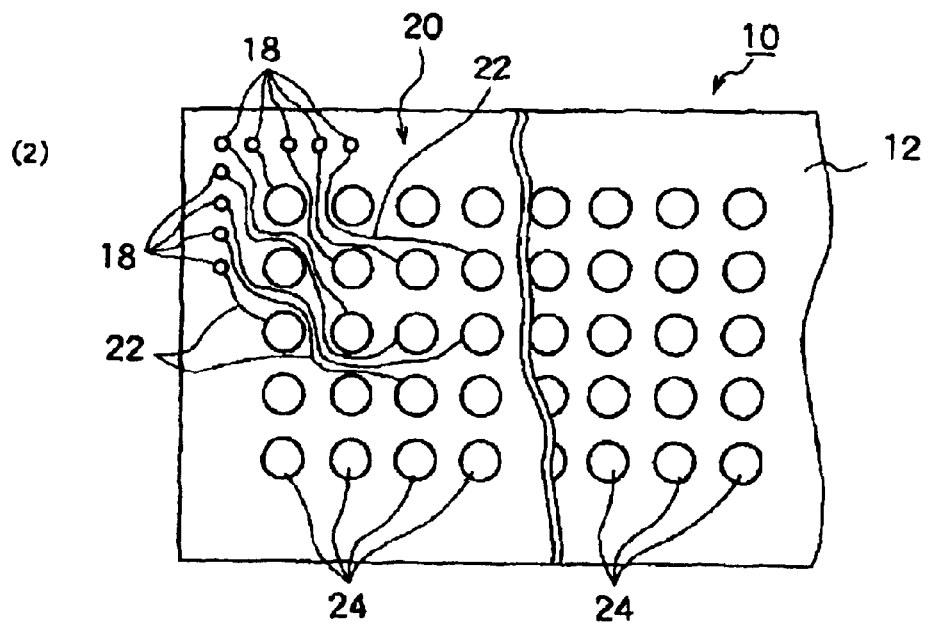

FIGS. 1(1) and (2) are a perspective view and a side view showing an embodiment of a semiconductor device in accordance with an embodiment of the invention. FIGS. 2(1) and (2) are a cross-sectional enlarged view and a rear view showing the semiconductor device.

As shown in these drawings, in a semiconductor device 10 (hereafter referred to as "semiconductor device 10") related to this embodiment, a plurality of semiconductor chips 14 (three semiconductor chips in this embodiment) are mounted on one surface side of a connection substrate 12 that is flexible.

The connection substrate 12 of the semiconductor device 10 has a band-like shape with a predetermined width. On a surface 13, in order to achieve electric conduction of the semiconductor chips 14, first metal wires 16 are wound around which perform electric conduction. Furthermore, the first metal wires 16 wound around the surface 13 extend to a rear surface 20 side of the connection substrate 12 via contact holes 18 and are connected to second metal wires 22 (see FIG. (2)) that extend to the rear surface side. Additionally, by mounting solder balls 26 on connection lands 24 arranged on the second metal wires 22, mounting to an external substrate (not shown) can be accomplished via the solder balls 26.

Furthermore, the connection substrate 12 has flexibility. After mounting the semiconductor chips 14, as shown in FIG. 1(1), by folding the connection substrate 12 along folding lines 27 arranged between the semiconductor chips 14, a mounting area of the semiconductor device 10 can be reduced as shown in FIG. 1(2).

Furthermore, as shown in FIG. 2(2), a plurality of connection lands 24 are arranged on one side terminal end portion side of the connection substrate 12. The second metal wires 22, which extend from the contact holes 18, are connected to specified connection lands 24 so as to extend through other contact holes 18.

The following explains a procedure of manufacturing a semiconductor device 10 which is thus structured.

Figure 3:
FIGS. 3(1), (2), (3), and (4) are schematics showing a procedure of manufacturing a semiconductor device 10.
Figure 3:
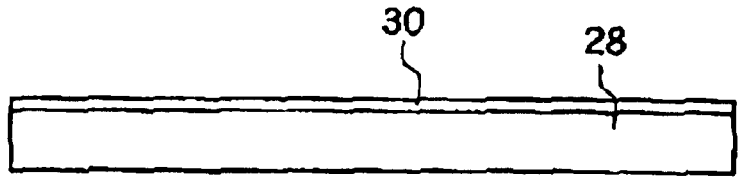
Figure 3:
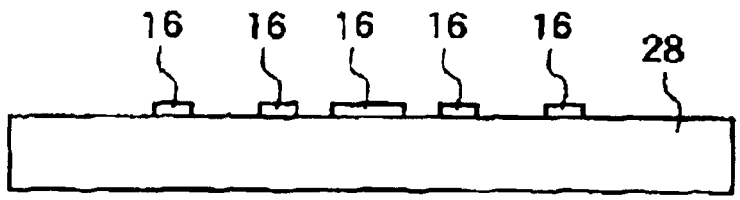
Figure 3:
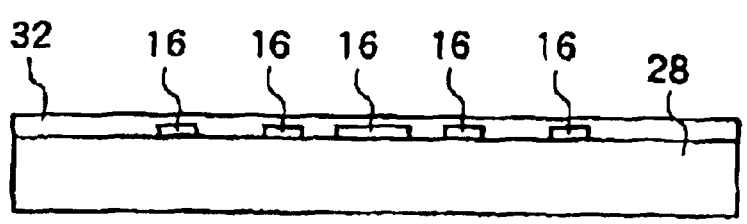
Figure 4:
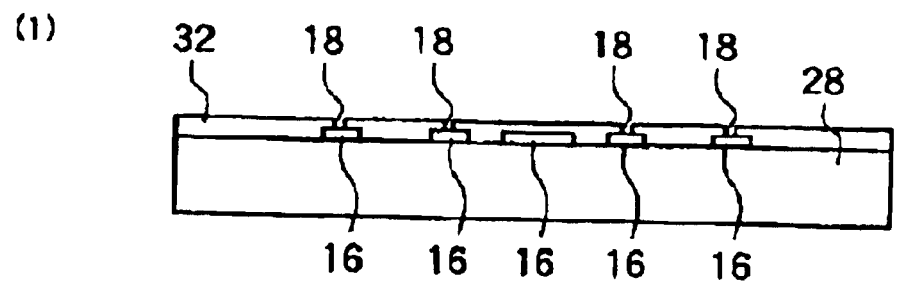
FIGS. 4(1), (2), (3), and (4) are schematics showing a procedure of manufacturing a semiconductor device 10.
Figure 4:
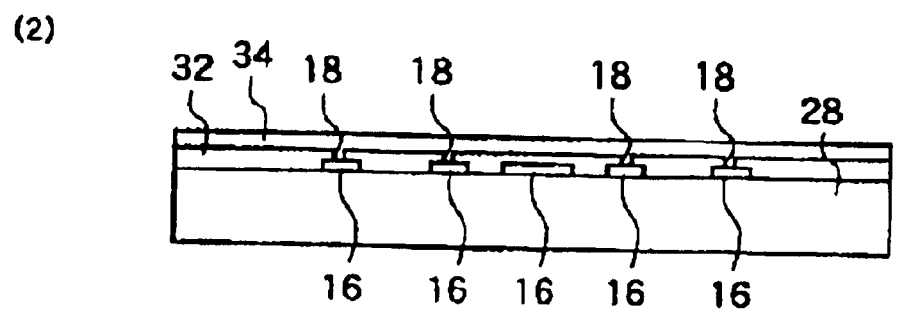
Figure 4:
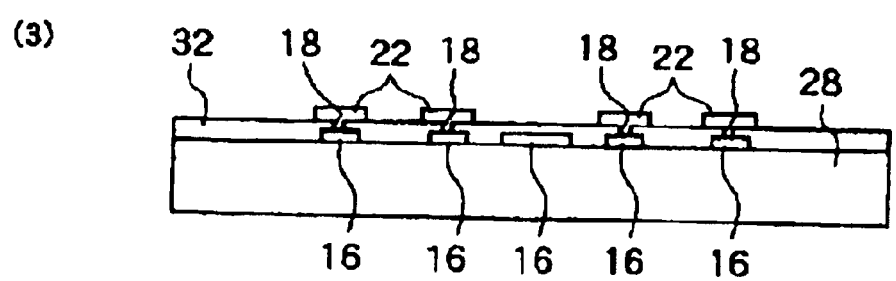
Figure 4:
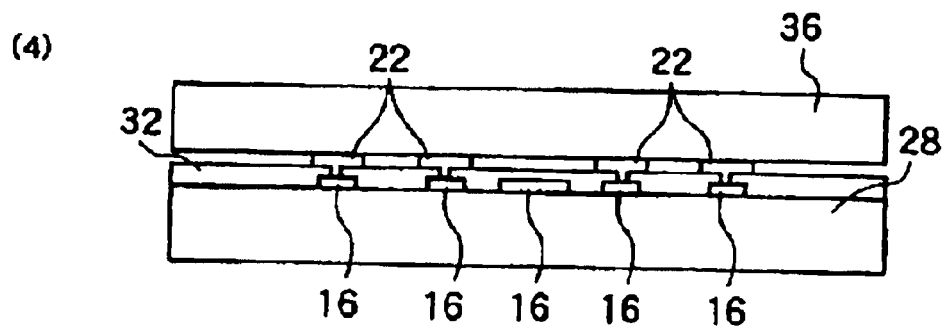
Figure 5:
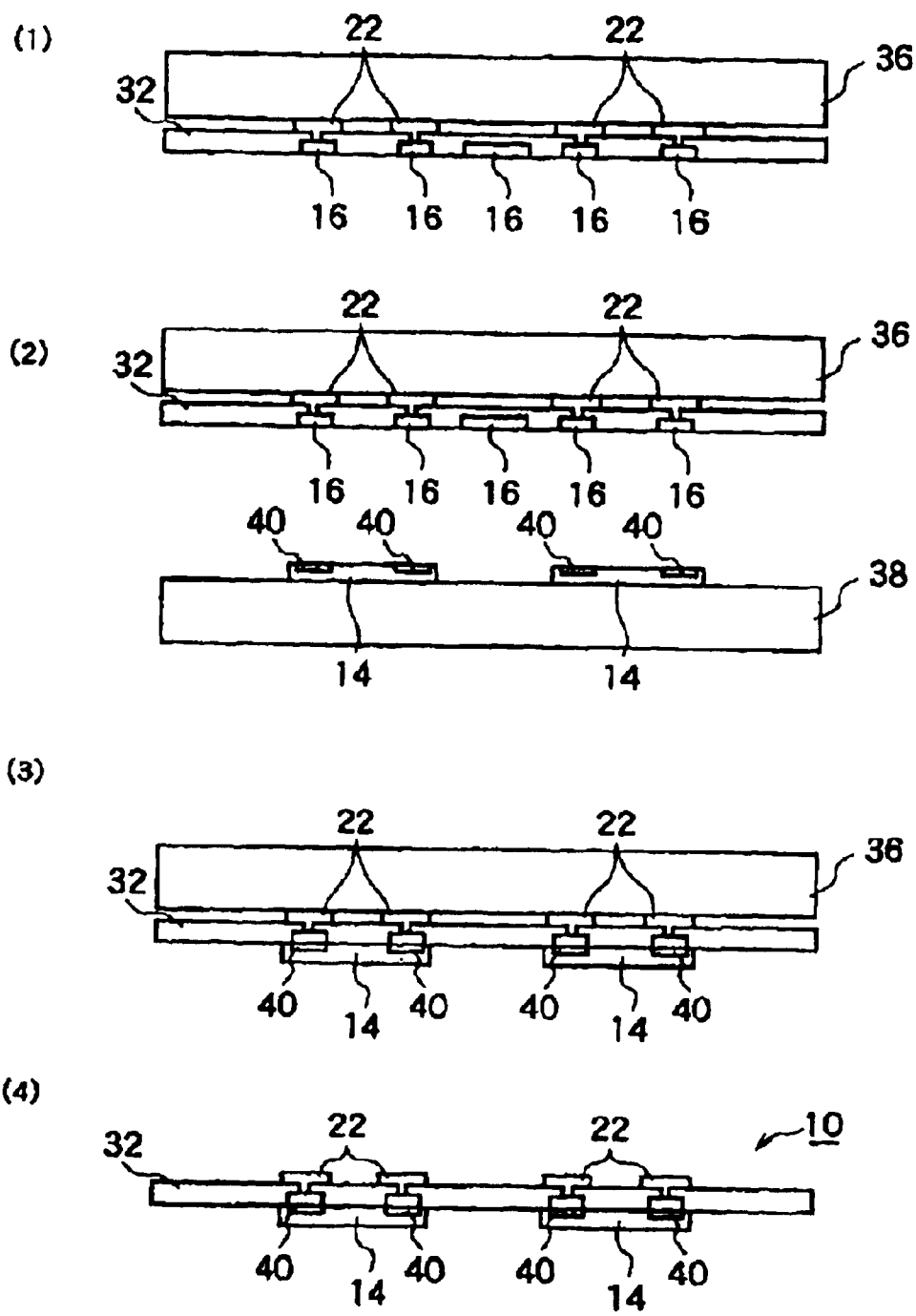
FIGS. 5(1), (2), (3), and (4) are schematics showing a procedure of manufacturing a semiconductor device 10.

FIGS. 3–5 are schematics showing a procedure of manufacturing the semiconductor device 10. As shown in FIG. 3(1), a base, which is not flexible, or a first glass base 28, which is a first base, is arranged. Furthermore, as shown in FIG. 3(2), the first glass base 28 is arranged in an Argon atmosphere having a pressure of 2–5 m Torr and a temperature of 150–300° C. Using Al—Cu, Al—Si—Cu, Al—Si, Ni, Cr, Au, or the like as a target, sputtering is performed with an input electric power of DC 9–12 kW. A metal film 30, which forms the first metal wires 16 and having the same composition as this target, is deposited at a thickness of 200–20000 Angstroms. Furthermore, in addition to the above-described exemplary embodiment, the metal film 30 can be formed by depositing 1000 Angstroms of Au on a Cr base.

Thus, after forming the metal film 30 on the surface of the first glass base 28, a photoresist film (not shown) is coated on the metal film 30. Next, patterning is performed by photolithography. The photoresist film, other than the part which forms the first metal wires 16, is removed. At the same time, etching is performed for the metal film 30 by using the photoresist film as a mask. FIG. 3(3) shows a state in which the metal film 30 is etched and the first metal wires 16 are formed.

A pattern of the first metal wires 16 is formed so that direct butting can be performed to a terminal of an element (s) such as a transistor, a resistance, and/or a capacitance formed on the surface of the semiconductor chips 14. Electrical conduction can be achieved by interfacing the surface of the first metal wires 16 with the surface of semiconductor chip 14.

Thus, after forming the first metal wires 16 on the surface of the first glass base 28, a polyimide agent, which becomes an insulating agent, is coated so as to cover the first wires 16 from above the first metal wires 16. After that, the polyimide agent is hardened, and an insulating layer 32 is formed. This is shown in FIG. 3(4). Here, the insulating layer 32 is formed of a polyimide agent, so it has flexibility after being hardened. Because of this, if the first metal wires 16 and the insulating layer 32 are separated from the first glass base 28, the first metal wires 16 and the insulating layer 32 will bend by an exterior force or under their own weight.

Additionally, after forming the insulating layer 32 so as to cover the first metal wires 16, a photoresist film (not shown) is coated on the insulating layer 32. Next, patterning is performed by photolithography. The photoresist film which forms the contact holes 18 is removed. At the same time, the insulating layer 32 is etched by using the photoresist film as a mask. The first metal wires 16 communicate with the bottom surface of the contact holes 18. FIG. 4(1) shows a state in which this insulating layer 32 is etched and contact holes 18 are formed.

Thus, after forming the contact holes, as shown in FIG. 4(2), the contact holes 18 are filled up. At the same time, a metal film 34 is formed so as to cover the insulating layer 32. In the metal film 34, in the same manner as the metal film 30, the first glass base 28 is deposited in a pressure of 2–5 m Torr in an Argon atmosphere having a temperature of 150–300° C. Using Al—Cu, Al—Si—Cu, Al—Si, Ni, Cr, Au, or the like as a target, sputtering is performed with an input electric power of DC 9–12 kW. A metal film 34, which forms the second metal wire 22 and having the same composition as this target, is deposited at a thickness of 200–20000 Angstroms.

Furthermore, after forming the metal film 34 in the surface of the insulating layer 32, a photoresist film (not shown) is coated on the metal film (not shown) 34. Next, patterning is performed by photolithography, and a photoresist film, other than the part which forms the second metal wires 22, is removed. At the same time, etching is performed for the metal film 34 by using the photoresist film as a mask. FIG. 4(3) shows a state in which the metal film 34 is etched and the second metal wires 22 are formed. Additionally, the second metal film 22 is formed on the contact holes 18, so electrical conduction is performed between the first metal wires 16 and the second metal wires 22 via the contact holes 18. Therefore, the first metal wires 16 and the second metal wires 22 are formed on both surfaces of the insulating film 32, and a connection substrate 12 that is flexible can be formed on the surface of the first glass base 28 with flexibility. Furthermore, in this type of connection substrate 12, metal wires are formed on the surface of the first glass base 28 that is not flexible. Because of this, distortion is not generated in the first glass base 28 due to an exterior force or under its own weight. Therefore, even when a photoresist is applied to the metal film 30 and the metal film 34, a focal point can be matched, so that metal wires with a narrow width and a narrow pitch can be formed. Thus, as shown in FIG. 2(2), a wire route can be formed in which a plurality of second metal wires 22 extend through contact holes 18 which are arranged in a grid state so as to be connected to arbitrary connection lands 24.

After the connection substrate 12 is thus formed, a second glass base 36, which is similar to the first glass base 28, is brought down from the direction above the connection substrate 12 and made to closely contact the second metal wire 22 side of the connection substrate 12. This state is shown in the same FIG. 4(4). Furthermore, after the second glass base 36 is connected to the second metal wires 22 of the connection substrate 12, the second glass base 36 is then raised, and the connection substrate 12 is transferred to the second glass base 36 side from the first glass base 28. This state is shown in FIG. 5(1). In the case of this transfer, if a solvent or the like, having a separation reaction due to light radiation, is coated on the surface of the first glass base 28, between the first glass base 28 and the connection substrate 12 in advance, after the connection substrate 12 is formed, the first glass base 28 and the connection substrate 12 can be easily separated by radiating light from a rear surface side of the first glass base 28. Alternatively, adhesive having an adhesive force which deteriorates due to radiation of ultraviolet light and X-ray, is coated in advance to the surface of the first glass base 28, and the connection substrate 12 is formed on the upper layer side of the adhesive layer. Additionally, at the time of separating the connection substrate 12 from the first glass base 28, ultraviolet light or X-rays from the rear surface side of the first glass base 28 is irradiated, and an adhesive force, of adhesive formed on the surface of the first glass base 28, is reduced so that the connection substrate 12 can be separated from the first glass base 28.

Furthermore, as shown in FIG. 5(2), after transferring the connection substrate 12 to the second glass base 36 side from the first glass base 28, the second glass base 36 is moved to a mounting stage 38 in which the semiconductor chips 14 are arranged. As shown in FIG. 5(3), terminal portions 40 of the elements, formed on the surface of the semiconductor chips 14 and the first metal wires 16, are conjugated by thermo-compression bonding. Here, the connection substrate 12 closely contacts the second glass base 36, so if a material which is close to a thermal expansion coefficient of a mono-crystalline silicon, that becomes a base material of a semiconductor chip 14, is applied to the second glass base 36, by radiation heat from a thermal compression bonding jig, even if the temperature increases on both sides, a pitch shift due to a difference of an expansion coefficient can be made small. Furthermore, instead of the second glass base 36, a base formed of a mono-crystalline silicon is used, a heat expansion coefficient becomes the same as that of the semiconductor chip 14, so a pitch shift due to temperature increase can be minimized. In addition, the connection substrate 12 contacts the second glass base 36. The connection substrate 12 does not raise in a thickness direction when the semiconductor chip 14 is mounted. Because of this, the semiconductor chip 14 can be firmly mounted to the connection substrate 12 without having short-circuiting.

Thus, after the semiconductor chip 14 is mounted on the connection substrate 12, until the final process, the connection substrate 12 is conveyed along with the second glass base 36 without separating the connection substrate 12 from the second glass base 36. If the semiconductor device 10 closely contacts the second glass base 36 during conveying, generation of deformation in the semiconductor device 10, due to an exterior force being applied to the semiconductor device 10 or due to the weight of the semiconductor device 10, can be prevented. Problems such as folding or distortion generated in the connection substrate 12, peeling of the semiconductor chip 14 from the connection substrate 12, or the like, can be prevented in advance.

Furthermore, in the final process, as shown in FIG. 5(4), the semiconductor device 10 is separated from the second glass base 36 (the separation method is the same as the first glass base 28), and the semiconductor device 10 itself can be folded along the folding line 27. Additionally, the insulating film 32 can have a thickness which covers the first metal wires 16 with a thickness of 5–10 μm, so a thickness of 10–20 μm is sufficient. Because of this, folding can be easily performed for a conventional insulating film (with a thickness of approximately 50 μm), and after being folded, it is possible to prevent the insulating film 32 from returning to its original shape due to a recovery force.

Furthermore, in this embodiment, the semiconductor chip 14 is mounted on the first metal wires 16 separated from the first glass base 28. However, this is not limited to this embodiment, and the semiconductor chip can also be mounted in the second metal wires 22 side. Because of this, a semiconductor chip can be mounted in the first metal wires 16 side and the second metal wires 22 side, and functions of the semiconductor device 10 can be further added.

Additionally, in this embodiment, the connection substrate 12 has a two-layer structure. However, this is not limited to this embodiment, and a multi-layer wire structure having a plurality of metal wires and insulating films can also be used. Thus, if the connection substrate 12 has a multi-layer wire structure, even if the number of the semiconductor chip or the number of mounting of the semiconductor chips increase and the number of wires increases, by making wire layers different, wire interference can be prevented. Therefore, winding of wiring in the connection substrate can be easily performed.

According to a method of manufacturing the connection substrate as explained above, a metal wire is formed on a base, then an insulating agent is applied to the metal wire to form a flexible insulation layer. Another metal wire is formed on the surface of said insulating layer, thereby connecting the metal wires which sandwich the insulating layer, through a contact hole formed in the insulating layer. Then, the metal wires and the insulating layer are separated from the base. Thus, the width and pitch of wires can be made narrow, and multi-layer wiring is possible.

Furthermore, according to the connection substrate, a structure is manufactured by the method of manufacturing the connection substrate, so that it is possible to make a width and a pitch of wires narrow and multi-layer wiring can be provided.

According to the method of manufacturing a semiconductor device, a connection substrate is formed on a base, wherein a metal wire is formed on a base, an insulating agent is applied to said metal wire to form a flexible insulating layer, another metal wire is formed on the surface of the insulating layer, a connection substrate is formed on the base, thereby connecting the metal wires which sandwich the insulating layer through a contact hole formed in the insulating layer. Then, a semiconductor chip is mounted on the metal wire which is bared, and the connection substrate is separated from the base. Therefore, the width and pitch of the wiring can be made narrow, and multi-layer wiring is possible. Furthermore, at the time of mounting the semiconductor chip, the effect of the radiation heat such as a heating tool or the like can be reduced, and a damage such as wire disconnection due to an exterior force can be prevented.

According to the method of manufacturing of the semiconductor device, a connection substrate is formed on a base, wherein a metal wire to be connected to an electrode formed on a semiconductor chip is formed on a first base, an insulating material is applied onto the metal wire to form an insulating layer, another metal wire is formed on the insulating layer, thereby connecting the metal wires which sandwich the insulating layer, through a contact hole formed in the insulating layer. A second base is disposed on the connection substrate. The first base is separated from the connection substrate. A semiconductor chip is mounted on the metal wire that is bared. The connection substrate is separated from the second base. Therefore, the width and pitch of the wiring can be made narrow, and multi-layer wiring is possible. Furthermore, even if metal wiring is not formed on the surface of the semiconductor chip, electrical conduction can be accomplished by a butt joint with the connection substrate. Additionally, at the time of mounting the semiconductor chip, the effect of the radiation heat such as a heating tool or the like can be reduced, and a damage such as wire disconnection due to an exterior force can be prevented.

According to the semiconductor device, manufacturing can be accomplished by a method of manufacturing a semiconductor device, so that the films of the insulating layer can easily be made thin. Because of this, it can be folded easily. Furthermore, returning of the connection substrate after folding can be prevented.

What is claimed is:

1. A method of manufacturing a connection substrate, comprising steps of:
   forming a metal wire on a base;
   applying an insulating material onto the metal wire to form an insulation layer;
   forming another metal wire on the insulation layer, thereby connecting the metal wires which sandwich the insulation layer, through a contact hole formed in the insulation layer; and
   separating the metal wires and the insulation layer from the base upon irradiating light or X-rays through the base.

2. The method of manufacturing a connection substrate according to claim 1,
   wherein the step of applying an insulating material onto the metal wire, and the step of forming another metal wire, thereby connecting the metal wires are repeated at least two times.

3. The method of manufacturing of a connection substrate according to claim 1,
   wherein the base comprises glass.

4. A method of manufacturing a semiconductor device, comprising:
   a step of forming a connection substrate on a base, comprising, forming a metal wire on a base, applying an insulating material onto the metal wire to form an insulation layer, and forming another metal wire on the insulation layer, thereby connecting the metal wires which sandwich the insulation layer through a contact hole formed in the insulation layer;
   a step of mounting a semiconductor chip on the metal wire which is bared; and a step of separating the connection substrate from the base upon irradiating light or X-rays through the base.

5. The method of manufacturing a semiconductor device of claim 4, wherein a plurality of the semiconductor chips are mounted on the connection substrate.

6. The method of manufacturing a semiconductor device of claim 4, wherein in the step of forming a connection substrate, the step of applying an insulating material onto the metal wire and the step of forming another metal wire, thereby connecting the metal wires are repeated at least two times.

7. The method of manufacturing a semiconductor device of claim 4, wherein the base comprises glass.

8. The method of manufacturing a semiconductor device of claim 4, wherein the base comprises silicon.

9. A method of manufacturing a semiconductor device, comprising:

a step of forming a connection substrate on a base, comprising, forming a metal wire to be connected to an electrode formed on a semiconductor chip, on a first base, applying an insulating material onto the metal wire to form an insulation layer, and forming another metal wire on the insulation layer, thereby connecting the metal wires which sandwich the insulation layer, through a contact hole formed in the insulation layer;

a step of disposing a second base on the connection substrate;

a step of separating the first base from the connection substrate upon irradiating light or X-rays through the base;

a step of mounting a semiconductor chip on the metal wire that is bared; and a step of separating the connection substrate from the second base.

10. The method of manufacturing a semiconductor device of claim 9, wherein the second base comprises glass.

11. The method of manufacturing a semiconductor device of claim 9, wherein the second base comprises silicon.

12. The method of manufacturing a semiconductor device of claim 9, wherein a plurality of the semiconductor chips are mounted on the connection substrate.

13. The method of manufacturing a semiconductor device of claim 9, wherein in the step of forming a connection substrate the step of applying an insulating material onto the metal, and the step of forming another metal wire, thereby connecting the metal wires are repeated at least two times.

14. A method of manufacturing a connection substrate, comprising steps of:

forming a metal wire on a first surface of a light transmissive base, and the first surface is coated by a solvent having a separation reaction due to light;

applying an insulating material onto the metal wire to form an insulation layer;

forming another metal wire on the insulation layer, thereby connecting the metal wires which sandwich the insulation layer, through a contact hole formed in the insulation layer; and separating the metal wires and the insulation layer from the light transmissive base upon radiating light through the light transmissive base.

15. The method of manufacturing a connection substrate according to claim 14, the step of applying an insulating material onto the metal wire, and the step of forming another metal wire, thereby connecting the metal wires being repeated at least two times.

16. A method of manufacturing a semiconductor device, comprising:

a step of forming a connection substrate on a base, comprising, forming a metal wire on a first surface of a light transmissive base, and the first surface is coated by a solvent having a separation reaction due to light, applying an insulating material onto the metal wire to form an insulation layer and forming another metal wire on the insulation layer, thereby connecting the metal wires which sandwich the insulation layer through a contact hole formed in the insulation layer;

a step of mounting a semiconductor chip on the metal wire which is bared; and a step of separating the connection substrate from the light transmissive base upon radiating light through the base.

17. The method of manufacturing a semiconductor device of claim 16, a plurality of the semiconductor chips being mounted on the connection substrate.

18. The method of manufacturing a semiconductor device of claim 16, in the step of forming a connection substrate, the step of applying an insulating material onto the metal wire and the step of forming another metal wire, thereby connecting the metal wires being repeated at least two times.

19. A method of manufacturing a semiconductor device, comprising:

a step of forming a connection substrate on a base, comprising, forming a metal wire to be connected to an electrode formed on a semiconductor chip, on a first surface of a first light transmissive base and the first surface is coated by a solvent having a separation reaction due to light, applying an insulating material on the metal wire to form an insulation layer, and forming another metal wire on the insulation layers, thereby connecting the metal wires which sandwich the insulation layer, through a contact hole formed in the insulation layer;

a step of disposing a second base on the connection substrate;

a step of separating the first light transmissive base from the connection substrate upon radiating light through the base;

a step of mounting a semiconductor chip on a metal wire that is bared; and a step of separating the connection substrate from the second base.

20. The method of manufacturing a semiconductor device of claim 19, the second base comprising glass.

21. The method of manufacturing a semiconductor device of claim 19, the second base comprising silicon.

22. The method of manufacturing a semiconductor device of claim 19, a plurality of the semiconductor chips being mounted on the connection substrate.

23. The method of manufacturing a semiconductor device of claim 19, in the step of forming a connection substrate, the step of applying an insulating material onto the metal, and the step of forming another metal wire, thereby connecting the metal wires being repeated at least two times.

* * * * *